United States Patent
Hsieh et al.

(10) Patent No.: US 9,158,877 B2
(45) Date of Patent: Oct. 13, 2015

(54) STANDARD CELL METAL STRUCTURE DIRECTLY OVER POLYSILICON STRUCTURE

(71) Applicant: TAIWAN SEMICONDUCTOR MANUFACTURING COMPANY, LTD., Hsinchu (TW)

(72) Inventors: Shang-Chih Hsieh, Yangmei (TW); Hui-Zhong Zhuang, Kaohsiung (TW); Ting-Wei Chiang, New Taipei (TW); Chun-Fu Chen, Chiayi (TW); Hsiang-Jen Tseng, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/015,924

(22) Filed: Aug. 30, 2013

(65) Prior Publication Data

US 2014/0327081 A1 Nov. 6, 2014

Related U.S. Application Data

(60) Provisional application No. 61/818,694, filed on May 2, 2013.

(51) Int. Cl.
*G06F 17/50* (2006.01)
*H01L 29/78* (2006.01)

(52) U.S. Cl.
CPC ........ *G06F 17/5072* (2013.01); *G06F 17/5068* (2013.01); *H01L 29/785* (2013.01)

(58) Field of Classification Search
CPC ............ G06F 17/5072; G06F 17/5068; H01L 29/785
See application file for complete search history.

(56) References Cited

U.S. PATENT DOCUMENTS

| | | | |
|---|---|---|---|
| 6,525,350 B1 * | 2/2003 | Kinoshita et al. | 257/202 |
| 7,469,389 B2 * | 12/2008 | Namba et al. | 716/120 |
| 8,446,176 B1 * | 5/2013 | Yang et al. | 326/103 |
| 8,455,354 B2 * | 6/2013 | Chen et al. | 438/666 |
| 2007/0090485 A1 * | 4/2007 | Takao | 257/510 |
| 2009/0209097 A1 * | 8/2009 | Schulz et al. | 438/638 |
| 2011/0298085 A1 * | 12/2011 | Terletzki | 257/516 |
| 2013/0270644 A1 * | 10/2013 | Anderson et al. | 257/368 |

FOREIGN PATENT DOCUMENTS

| | | |
|---|---|---|
| JP | 2001127169 | 5/2001 |
| JP | 2005251862 | 9/2005 |
| JP | 2010074158 | 4/2010 |
| JP | 2012238144 | 12/2012 |

* cited by examiner

*Primary Examiner* — Naum B Levin
(74) *Attorney, Agent, or Firm* — Lowe Hauptman & Ham, LLP (57) ABSTRACT

A semiconductor structure includes a first active area structure, an isolation structure surrounding the first active area structure, a first polysilicon structure, a first metal structure, and a second metal structure. The first polysilicon structure is over the first active area structure. The first metal structure is directly over a first portion of the first active area structure. The second metal structure is directly over and in contact with a portion of the first polysilicon structure and in contact with the first metal structure.

23 Claims, 5 Drawing Sheets

STANDARD CELL METAL STRUCTURE DIRECTLY OVER POLYSILICON STRUCTURE

CLAIM OF PRIORITY

The present application claims priority of U.S. Provisional Patent Application No. 61/818,694, filed on May 2, 2013, the disclosure of which is incorporated herein by reference in its entirety

RELATED APPLICATIONS

The present application relates to co-pending U.S. patent application Ser. No. 14/253,205, titled "STANDARD CELL HAVING CELL HEIGHT BEING NON-INTEGRAL MULTIPLE OF NOMINAL MINIMUM PITCH" and U.S. paent application Ser. No. 14/051,881, titled "STANDARD CELLS FOR PREDETERMINED FUNCTION HAVING DIFFERENT TYPES OF LAYOUT," the disclosures of which are incorporated herein by reference in their entireties.

BACKGROUND

In the design of an integrated circuit, standard cells having predetermined functions are used. Pre-designed layouts of standard cells are stored in cell libraries. When designing an integrated circuit, the pre-designed layouts of the standard cells are retrieved from the cell libraries and placed into one or more desired locations on an integrated circuit layout. Routing is then performed to connect the standard cells with each other using metal tracks. The integrated circuit layout is thereafter used to manufacture the integrated circuit using a predetermined semiconductor manufacturing process.

DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
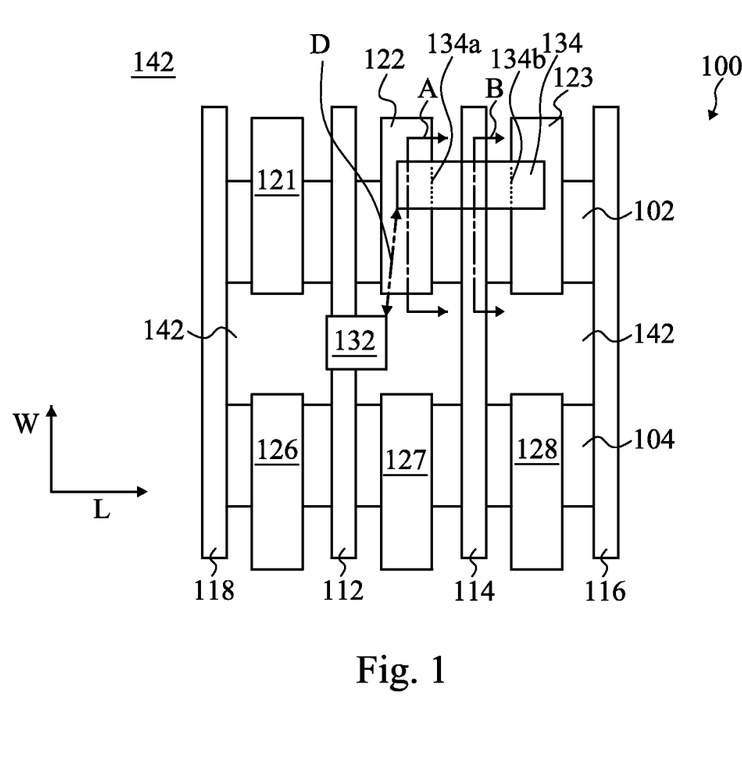
FIG. 1 is a layout schematic drawing of a standard cell in accordance with one or more embodiments.

FIG. 1 is a layout schematic drawing of a standard cell 100 in accordance with one or more embodiments. Not all layout patterns of the standard cell 100 are depicted in FIG. 1. Also, a person having ordinary skill in the art would appreciate that the layout patterns will be used to prepare a set of masks, that are in turn usable for manufacturing the standard cell in an integrated circuit.

The layout of the standard cell 100 includes first active area layout pattern 102, second active area layout pattern 104, polysilicon layout patterns 112, 114, 116, and 118, metal layout patterns of a first type 121, 122, 123, 126, 127, and 128, and metal layout patterns of a second type 132 and 134. Active area layout patterns 102 and 104 are associated with forming active area structures of the standard cell 100. An isolation region 142 is outside at least the active area layout patterns 102 and 104. In some embodiments, because the active areas 102 and 104 and the isolation region 142 are geometrically mutually exclusive, active areas are sometimes referred to as oxide-definition (OD) areas. In some embodiments, active area layout pattern 102 defines a P-type transistor area, and active layout pattern 104 defines an N-type transistor area.

Polysilicon layout patterns 112, 114, 116, and 118 are associated with forming corresponding polysilicon structures of the standard cell 100. Metal layout patterns 121, 122, 123, 126, 127, and 128 are associated with forming corresponding metal structures of a first type. In some applications, the metal structures of the first type are also referred to as metal-zero layer over oxide-definition areas ("M0OD" or "MD") structures. Metal layout patterns 121, 122, 123, 126, 127, and 128 overlap active area layout patterns 102 and 104. In some applications, the resulting M0OD metal structures (based on metal layout patterns 121, 122, 123, 126, 127, and 128) are usable as source/drain electrodes of one or more transistors of the standard cell 100. Metal layout patterns 132 and 134 are associated with forming corresponding metal structures of a second type. In some applications, the metal structures of the second type are also referred to as metal-zero layer over polysilicon ("M0PO" or "MP") structures.

As depicted in FIG. 1, polysilicon layout patterns 112, 114, 116, and 118 are configured to overlap the active area layout patterns 102 and 104. In some embodiments, polysilicon layout patterns 112 and 114 are associated with forming gate electrodes of the standard cell 100, and polysilicon layout patterns 116 and 118 are associated with forming polysilicon structures along edges of active area structures corresponding to active area layout patterns 102 and 104. In some applications, the resulting polysilicon structures based on polysilicon layout patterns 116 and 118 are also referred to as polysilicon at oxide-definition edge ("PODE") structures. In some embodiments, the PODE structures do not constitute any functional feature of one or more transistors of the standard cell 100.

The M0PO structure corresponding to metal layout patterns 132 is usable to electrically connect a polysilicon structure resulting from polysilicon layout pattern 112 to a via plug over the M0PO structure (based on metal layout pattern 132). Metal layout pattern 134 is configured to overlap the polysilicon layout pattern 114 and the metal layout patterns 122 and 123. Thus, the M0PO structure corresponding to metal layout patterns 134 is usable to electrically connect M0OD structures (based on metal layout patterns 122 and 123) and the polysilicon structure resulting from polysilicon layout pattern 114. In some embodiments, metal layout pattern 134 only overlaps one of the metal patterns 122 and 123. In some embodiments, metal layout pattern 134 overlaps one or more of the metal patterns 121, 122, and 123 and polysilicon layout patterns 112, 114, 116, and 118.

In the embodiment depicted in FIG. 1, metal layout pattern 134 overlaps active area layout pattern 102 and the isolation region 142. Also, as depicted in FIG. 1, metal layout pattern 134 extends horizontally beyond the active area layout pattern 102 along a channel width direction W of the active area layout pattern 102. In some embodiments, metal layout pattern 134 extends horizontally beyond the active area layout pattern 102 along a channel length direction L of the active area layout pattern 102.

In some embodiments, the layout patterns 132 and 134 are used for fabricating M0PO structures for standard cell 100. A distance D between layout patterns 132 and 134, and/or the total area or pattern area density of layout patterns for fabricating M0PO structures are governed by a set of predetermined design rules associated with a predetermined manufacturing process that is used to manufacture the standard cell. In some embodiments, the set of predetermined design rules does not have a rule against placing layout pattern 134 for a M0PO structure to cross over boundaries between the active area layout pattern 102 or 104 and isolation region 142.

In view of the layout schematic drawing depicted in FIG. 1, the resulting standard cell 100 manufactured based on the layout patterns of FIG. 1 would have active area structures (based on layout patterns 102 and 104), an isolation structure surrounding the active area structures, polysilicon structures (based on layout patterns 112, 114, 116, and 118) over the active area structures, a M0OD metal structure (based on layout patterns 122 or 123) directly over a portion of the active area structure (based on layout pattern 102), and a M0PO metal structure directly over and in contact with a portion of the polysilicon structure (based on layout pattern 114) and in contact with the M0OD metal structure. In some embodiments, the M0PO metal structure is no higher than the M0OD metal structure, and thus the M0OD metal structure is also in contact with a sidewall of a corresponding M0PO metal structure. For example, the M0PO metal structure based on layout pattern 134 contacts a sidewall of the M0OD metal structure based on layout pattern 122 at a position corresponding to reference line 134a, and the M0PO metal structure based on layout pattern 134 contacts a sidewall of the M0OD metal structure based on layout pattern 123 at a position corresponding to reference line 134b.

Figure 2A:
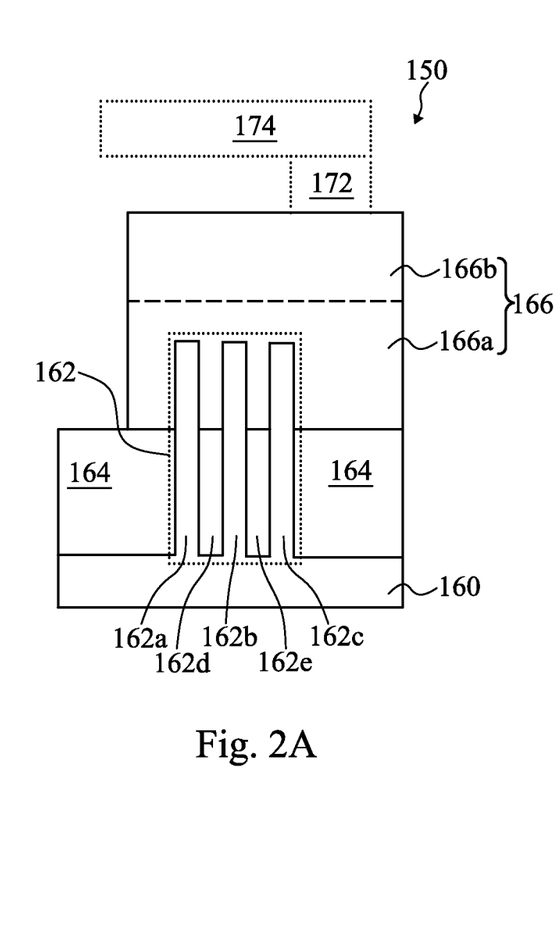
FIG. 2A is a cross-sectional view of a semiconductor structure manufactured according to the layout depicted in FIG. 1 and taken along reference line A in accordance with one or more embodiments.
Figure 2B:
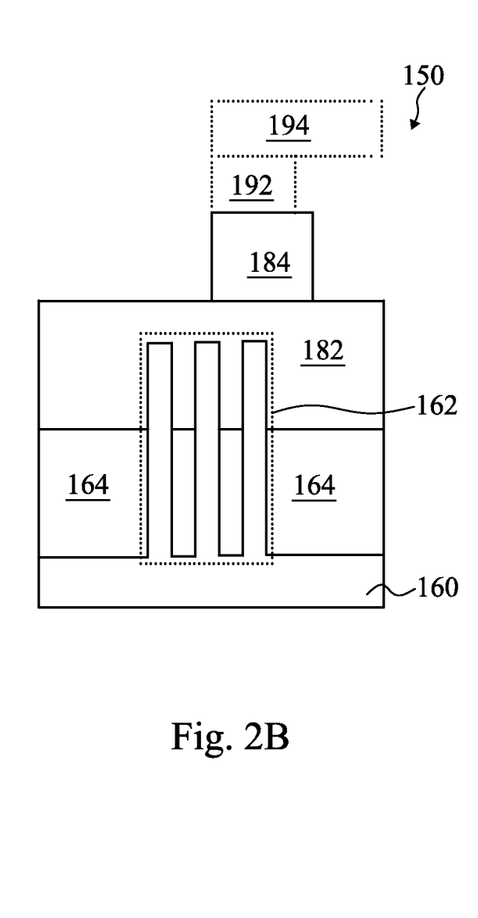
FIG. 2B is a cross-sectional view of a semiconductor structure manufactured according to the layout depicted in FIG. 1 and taken along reference line B in accordance with one or more embodiments.

The physical structure of the resulting standard cell is further illustrated by FIGS. 2A and 2B.

FIG. 2A is a cross-sectional view of a semiconductor structure 150 manufactured according to the layout 100 depicted in FIG. 1 and taken along reference line A in accordance with one or more embodiments. Semiconductor structure 150 includes a substrate 160, an active area structure 162 over the substrate, an isolation structure 164 surrounding the active area structure, and a M0OD metal structure 166 directly over the active area structure and the isolation structure.

In some embodiments, the substrate 160 comprises an elementary semiconductor, a compound semiconductor, an alloy semiconductor, or combinations thereof. Examples of the elementary semiconductor include, but are not limited to, silicon and germanium. Examples of a compound semiconductor include, but are not limited to, silicon carbide, gallium arsenic, gallium phosphide, indium phosphide, indium arsenide, and indium antimonide. Examples of the alloy semiconductor include, but are not limited to, SiGe, GaAsP, AlInAs, AlGaAs, GaInAs, GaInP, and GaInAsP. Other semiconductor materials including group III, group IV, and group V elements are used in some embodiments. In one or more embodiments, the substrate 160 comprises a semiconductor on insulator (SOI), a doped epitaxial layer, a gradient semiconductor layer, and/or a stacked semiconductor structure with one semiconductor layer (e.g., Si) overlying another semiconductor layer (e.g., Ge) of a different type. In some embodiments, the substrate 160 comprises a P-type doped substrate. Examples of P-type dopants in the P-doped substrate include, but are not limited to, boron, gallium, and indium.

As depicted in FIG. 1 and FIG. 2A, active area structure 162 corresponds to the layout pattern 102 includes a multiple-fin structure, such as three fins in FIG. 2A. In the embodiment depicted in FIG. 2A, active area structure 162 includes fins 162a, 162b, and 162c, and isolation regions 162d and 162e. In some embodiments, fins 162a, 162b, and 162c are made of substantially the same material as that of the substrate 160. In some embodiments, fins 162a, 162b, and 162c are N-type doped in order for forming a P-type transistor. In some embodiments, fins 162a, 162b, and 162c are P-type doped in order for forming an N-type transistor. In some embodiments, one or more additional masks with various layout patterns are also used in conjunction with one or more masks having layout pattern 102 to fabricate active area structure 162.

The M0OD metal structure 166 corresponds to the layout pattern 122. In some embodiments, the M0OD metal structure 166 is manufactured using a two-step approach: first forming lower M0OD metal structure 166a and then forming upper M0OD metal structure 166b. In some embodiments, M0OD metal structure 166 is manufactured using a one-step approach. One or more additional metal structures, such as metal-one layer via plug 172 and metal-one layer conductive line 174 are formed over the M0OD metal structure 166. In some embodiments, M0OD metal structure 166 has a material including tungsten, composite copper, or composite tungsten.

FIG. 2B is a cross-sectional view of a semiconductor structure 150 manufactured according to the layout 100 depicted in FIG. 1 and taken along reference line B in accordance with one or more embodiments. As depicted in FIGS. 2A and 2B, polysilicon structure 182 is directly over the active area structure 162. The polysilicon structure 182 corresponds to the layout pattern 114. The M0PO metal structure 184 is directly over and in contact with the polysilicon structure 182. The M0PO metal structure 184 is directly over both the active area structure 162 and the isolation structure 164. In some embodiments, the M0PO metal structure 184 and the active area structure 162 are separated by one or more layers of dielectric layers and/or gate structures (not shown). The M0PO metal structure 184 corresponds to the layout pattern 134. In some embodiment, M0PO metal structure 184 has a material including tungsten, composite copper, or composite tungsten.

Further detailed description of other spatial relationships among various features of the standard cell 100 is omitted, because such spatial relationships are similar to and can be clearly obtainable from those of the corresponding layout patterns.

In some embodiments, using M0PO metal structures to connect various components, such as M0PD structures or polysilicon structures, within a standard cell helps to minimize the area in the metal-0 layer or other interconnection layers occupied by the standard cell itself. Accordingly, more interconnection routing resources are available for the routing processing performed by a placing and routing tool.

Figure 3:
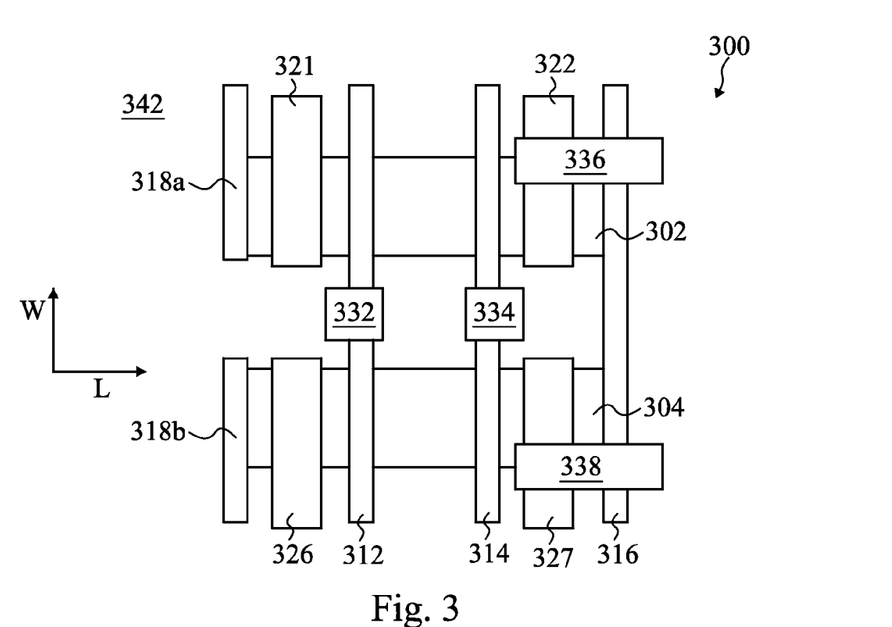
FIG. 3 is another layout schematic drawing of a standard cell in accordance with one or more embodiments.

FIG. 3 is another layout schematic drawing of a standard cell 300 in accordance with one or more embodiments. The layout of standard cell 300 includes first active area layout pattern 302, second active area layout pattern 304, polysilicon layout patterns 312, 314, 316, 318a, and 318b, metal layout patterns of a first type 321, 322, 326, and 327, and metal layout patterns of a second type 332, 334, 336, and 338. Active area layout patterns 302 and 304 are associated with forming active area structures of the standard cell 300. An isolation region 342 is outside at least the active area layout patterns 302 and 304. Polysilicon layout patterns 312, 314, 316, 318a, and 318b are associated with forming corresponding polysilicon structures of the standard cell 300. Metal layout patterns 321, 322, 326, and 327 are associated with forming corresponding M0OD metal structures. Metal layout patterns 332, 334, 336, and 338 are associated with forming corresponding M0PO metal structures.

In the embodiment depicted in FIG. 3, metal layout patterns 336 and 338 are used to form M0PO metal structures that electrically connect a polysilicon structure (based on layout pattern 316) and M0OD metal structures (based on layout pattern 322 and 327). In order to meet predetermined design rules, after a position and a size of layout pattern 334 is determined, layout pattern 336 extends horizontally beyond the first active area layout pattern 302 along a channel width direction W and a channel length direction L of the first active area layout pattern. Also, layout pattern 338 extends horizontally beyond the second active area layout pattern 304 along a channel width direction W and a channel length direction L of the second active area layout pattern.

Figure 4:
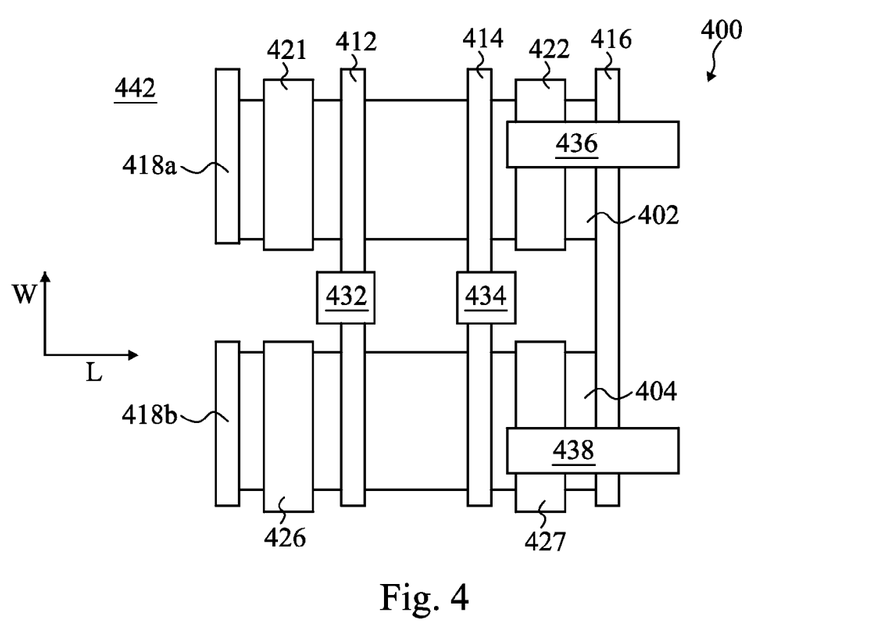
FIG. 4 is yet another layout schematic drawing of a standard cell in accordance with one or more embodiments.

FIG. 4 is yet another layout schematic drawing of a standard cell 400 in accordance with one or more embodiments. The layout of standard cell 400 includes first active area layout pattern 402, second active area layout pattern 404, polysilicon layout patterns 412, 414, 416, 418a, and 418b, metal layout patterns of a first type 421, 422, 426, and 427, and metal layout patterns of a second type 432, 434, 436, and 438. Active area layout patterns 402 and 404 are associated with forming active area structures of the standard cell 400. An isolation region 442 is outside at least the active area layout patterns 402 and 404. Polysilicon layout patterns 412, 414, 416, 418a, and 418b are associated with forming corresponding polysilicon structures of the standard cell 400. Metal layout patterns 421, 422, 426, and 427 are associated with forming corresponding M0OD metal structures. Metal layout patterns 432, 434, 436, and 438 are associated with forming corresponding M0PO metal structures.

In the embodiment depicted in FIG. 4, similar to the embodiment depicted in FIG. 3, metal layout patterns 436 and 438 are used to form M0PO metal structures that electrically connect a polysilicon structure (based on layout pattern 416) and M0OD metal structures (based on layout pattern 422 and 427). In the embodiment depicted in FIG. 4, a dimension of active area patterns 402 and 404 is sufficiently large that layout patterns 436 and 438 do not extend horizontally beyond the active area layout patterns along a channel width direction W. However, in order to meet predetermined design rules, after a position and a size of layout pattern 434 is determined, layout patterns 436 and 438 still extend horizontally beyond the corresponding active area layout patterns along a channel length direction L.

Figure 5:
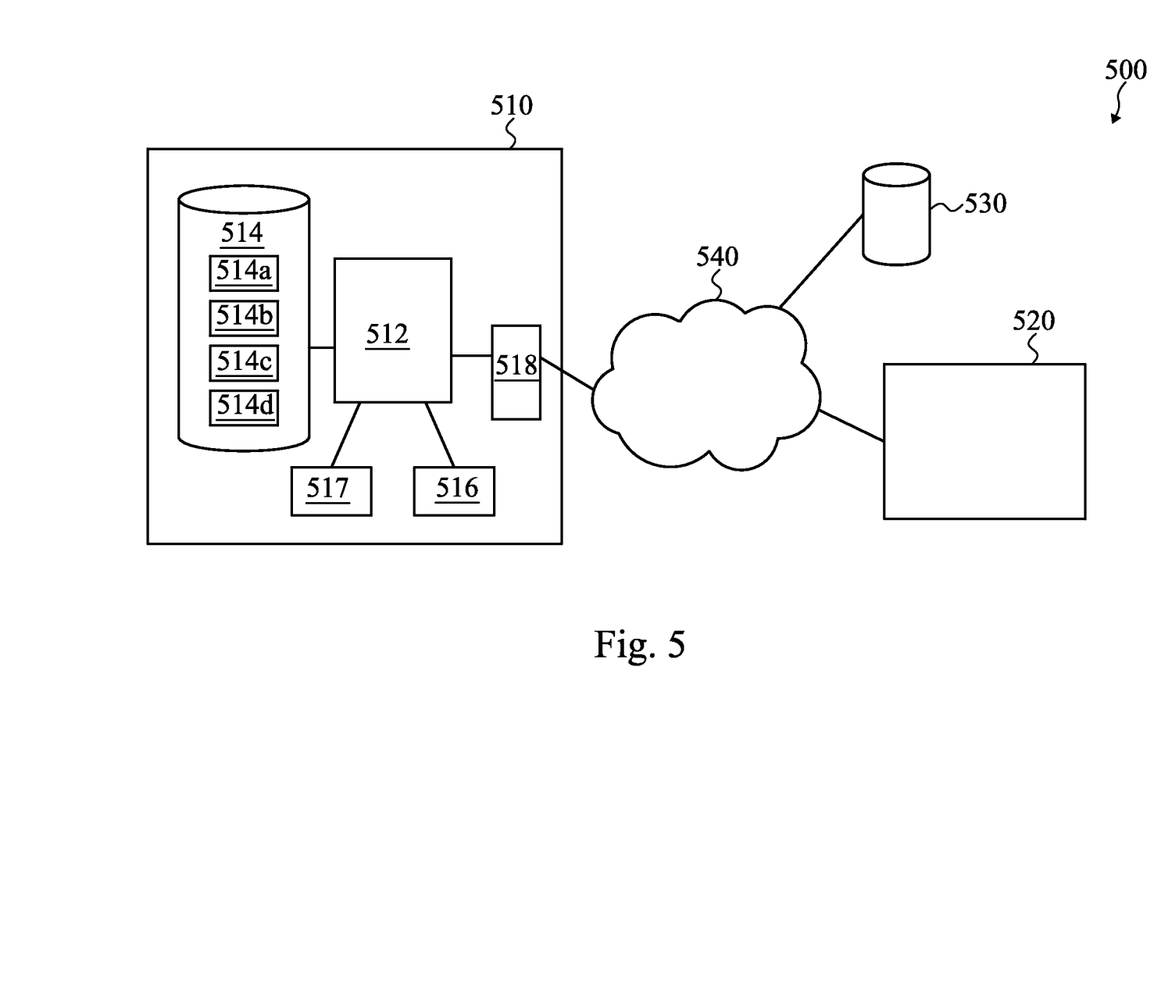
FIG. 5 is a functional block diagram of an integrated circuit designing system in accordance with one or more embodiments.

FIG. 5 is a functional block diagram of an integrated circuit designing system 500 in accordance with one or more embodiments. Integrated circuit designing system 500 includes a first computer system 510, a second computer system 520, a networked storage device 530, and a network 540 connecting the first computer system 510, the second computer system 520, and the networked storage device 530. In some embodiments, one or more of the second computer system 520, the storage device 530, and the network 540 are omitted.

The first computer system 510 includes a hardware processor 512 communicatively coupled with a non-transitory, computer readable storage medium 514 encoded with, i.e., storing, a generated integrated layout 514a, a circuit design 514b, a computer program code 514c, i.e., a set of executable instructions, and a standard cell library 514d having layout patterns as described in conjunction with FIGS. 1, 3, and 4. The processor 512 is electrically and communicatively coupled with the computer readable storage medium 514. The processor 512 is configured to execute a set of instructions 514c encoded in the computer readable storage medium 514 in order to cause the computer 510 to be usable as a placing and routing tool for generating a layout design based on the standard cell library 514d.

In some embodiments, standard cell library 514d is stored in a non-transitory storage medium other than storage medium 514. In some embodiments, standard cell library 514d is stored in a non-transitory storage medium in networked storage device 530 or second computer system 520. In such case, standard cell library 514d is accessible by the processor 512 through the network.

In some embodiments, the processor 512 is a central processing unit (CPU), a multi-processor, a distributed processing system, an application specific integrated circuit (ASIC), and/or a suitable processing unit.

In some embodiments, the computer readable storage medium 514 is an electronic, magnetic, optical, electromagnetic, infrared, and/or a semiconductor system (or apparatus or device). For example, the computer readable storage medium 514 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 514 includes a compact disk-read only memory (CD-ROM), a compact disk-read/write (CD-R/W), and/or a digital video disc (DVD).

The computer system 510 includes, in at least some embodiments, an input/output interface 516 and a display unit 517. The input/output interface 516 is coupled to the controller 512 and allows the circuit designer to manipulate the first computer system 510. In at least some embodiments, the display unit 517 displays the status of executing the placing and routing tool 514a in a real-time manner and preferably provides a Graphical User Interface (GUI). In at least some embodiments, the input/output interface 516 and the display 517 allow an operator to operate the computer system 510 in an interactive manner.

Figure 6:
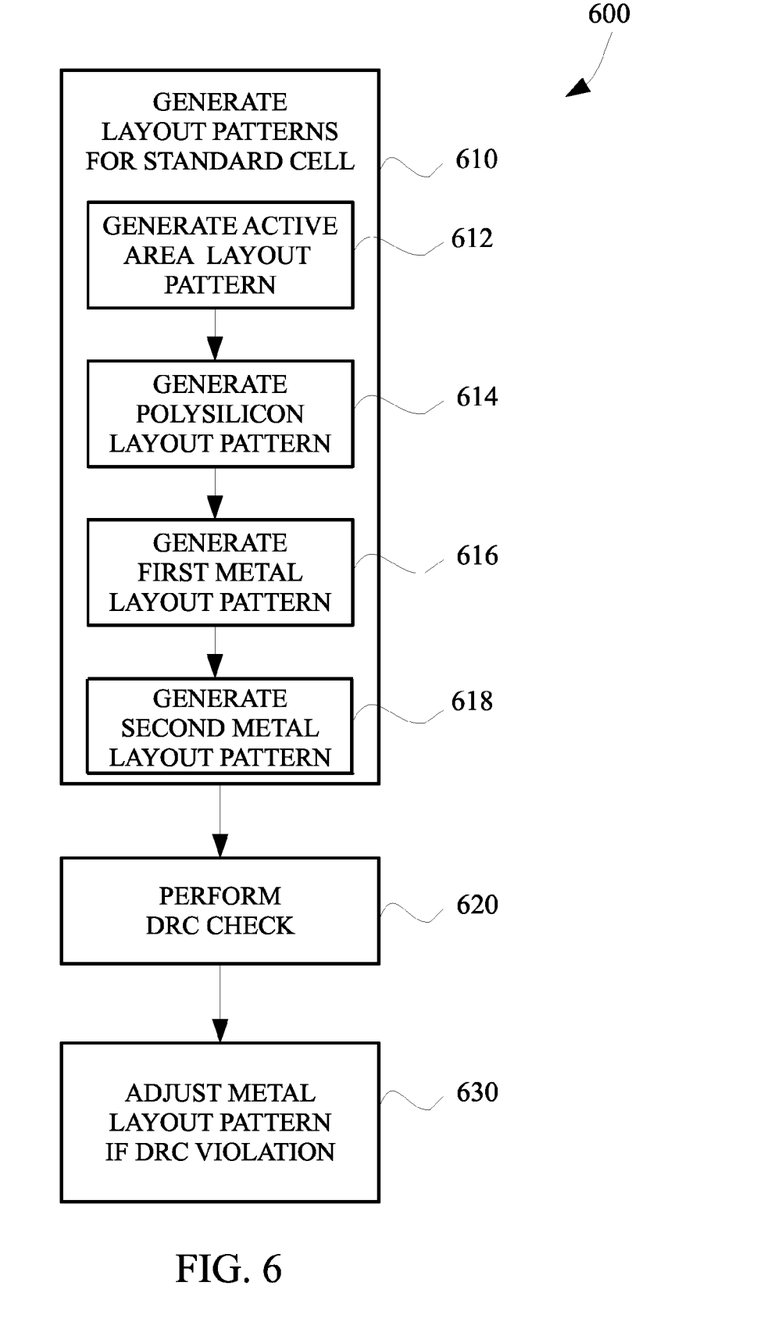
FIG. 6 is a flowchart of a method of generating a layout design in accordance with one or more embodiments.

FIG. 6 is a flowchart of a method 600 of generating a layout design in accordance with one or more embodiments. It is understood that additional operations may be performed before, during, and/or after the method 600 depicted in FIG. 6, and that some other processes may only be briefly described herein. In some embodiments, the method 600 is performed by operating a hardware computer (such as computer system 510 in FIG. 5).

In operation 610, layout patterns of a standard cell, such as layout patterns depicted in FIG. 100, are generated. The generated layout patterns include one or more layout patterns for forming M0PO structures. In some embodiments, the one or more layout patterns for forming M0PO structures overlap at least one, and not necessarily both, of corresponding active layout pattern and the corresponding isolation region of the standard cell. In some embodiments, one or more layout patterns for M0PO structures are generated overlap the corresponding active layout pattern and the corresponding isolation region.

For example, operation 610 includes generating an active area layout pattern associated with forming an active area of the standard cell, and an isolation region is outside at least the active area layout pattern (operation 612). Operation 610 further includes generating a polysilicon layout pattern associated with forming a polysilicon structure of the standard cell, and the polysilicon layout pattern is configured to overlap the active area layout pattern (operation 614). Operation 610 further includes generating a first metal layout pattern associated with forming a first metal structure of the standard cell, such as a first M0PO structure (operation 616). The first metal layout pattern is configured to overlap the active area layout pattern. Operation 610 further includes generating a second metal layout pattern associated with forming a second metal structure of the standard cell, such as a second M0PO structure (operation 618). The second metal layout pattern being configured to overlap the polysilicon layout pattern and the first metal layout pattern.

In operation 620, a Design Rule Check (DRC) is performed to determine if a design rule violation associated with the layout patterns for forming metal structures, such as M0PO structures, exists. Further, in operation 630, if it is determined that the design rule violation exists during operation 620, the design rule violation is resolved by moving the one or more layout patterns for metal structures into or further into the corresponding isolation region.

In accordance with one embodiment, a layout design usable for manufacturing a standard cell includes a first active area layout pattern, a first polysilicon layout pattern, a first metal layout pattern, and a second metal layout pattern. The first active area layout pattern is associated with forming a first active area of the standard cell, and an isolation region is outside at least the first active area layout pattern. The first polysilicon layout pattern is associated with forming a first polysilicon structure of the standard cell, and the first polysilicon layout pattern is configured to overlap the first active area layout pattern. The first metal layout pattern is associated with forming a first metal structure of the standard cell, and the first metal layout pattern is configured to overlap the first active area layout pattern. The second metal layout pattern is associated with forming a second metal structure of the standard cell, and the second metal layout pattern is configured to overlap the first polysilicon layout pattern and the first metal layout pattern.

In accordance with another embodiment, a semiconductor structure includes a first active area structure, an isolation structure surrounding the first active area structure, a first polysilicon structure, a first metal structure, and a second metal structure. The first polysilicon structure is over the first active area structure. The first metal structure is directly over a first portion of the first active area structure. The second metal structure is directly over and in contact with a portion of the first polysilicon structure and in contact with the first metal structure.

In accordance with another embodiment, an integrated circuit designing system includes a non-transitory storage medium and a hardware processor communicatively coupled with the non-transitory storage medium. The non-transitory storage medium is encoded with a layout design of a standard cell. The layout design includes a first active area layout pattern associated with forming a first active area of the standard cell, a first polysilicon layout pattern associated with forming a first polysilicon structure of the standard cell, a first metal layout pattern associated with forming a first metal structure of the standard cell, and a second metal layout pattern associated with forming a second metal structure of the standard cell. An isolation region is outside at least the first active area layout pattern. The first polysilicon layout pattern is configured to overlap the first active area layout pattern. The first metal layout pattern is configured to overlap the first active area layout pattern. The second metal layout pattern is configured to overlap the first polysilicon layout pattern and the first metal layout pattern. The hardware processor is configured to execute a set of instructions for generating an integrated circuit layout based on an original circuit design and the layout design of the standard cell.

In accordance with another embodiment, a method of generating a layout design usable for manufacturing a standard cell includes generating an active area layout pattern associated with forming an active area of the standard cell. An isolation region is outside at least the active area layout pattern. A polysilicon layout pattern associated with forming a polysilicon structure of the standard cell is generated. The polysilicon layout pattern is configured to overlap the active area layout pattern. A first metal layout pattern associated with forming a first metal structure of the standard cell is generated. The first metal layout pattern is configured to overlap the active area layout pattern. A second metal layout pattern associated with forming a second metal structure of the standard cell is generated. The second metal layout pattern is configured to overlap the polysilicon layout pattern and the first metal layout pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A layout design stored on a non-transitory computer-readable medium, the layout design comprising:
   a first active area layout pattern associated with forming a first active area structure of a standard cell, an isolation region being outside at least the first active area layout pattern;
   a first polysilicon layout pattern associated with forming a first polysilicon structure of the standard cell, the first polysilicon layout pattern being configured to overlap the first active area layout pattern;
   a first metal layout pattern associated with forming a first metal structure of the standard cell, the first metal layout pattern comprising a first pattern portion on a first side of the first polysilicon layout pattern and a second pattern portion on a second side of the first polysilicon layout pattern opposite the first side of the first polysilicon pattern, the first metal layout pattern being configured to overlap the first active area layout pattern; and a second metal layout pattern associated with forming a second metal structure of the standard cell, the second metal layout pattern comprising a continuous portion configured to overlap the first polysilicon layout pattern, the first pattern portion of the first active layout pattern and the second pattern portion of the first metal layout pattern, wherein the layout design is used to manufacture the standard cell.

2. The layout design of claim 1, wherein the second metal layout pattern is further configured to overlap the first active layout pattern and the isolation region.

3. The layout design of claim 2, wherein the second metal layout pattern extends horizontally beyond the first active area layout pattern along a channel width direction of the first active area layout pattern.

4. The layout design of claim 2, wherein the second metal layout pattern extends horizontally beyond the first active area layout pattern along a channel length direction of the first active area layout pattern.

5. The layout design of claim 1, further comprising:
a second active area layout pattern associated with forming a second active area of the standard cell, the isolation region also being outside the second active area layout pattern, the first active area layout pattern defining a P-type transistor area, and the second active area layout pattern defining an N-type transistor area, and the first polysilicon layout pattern being over the second active area layout pattern.

6. The layout design of claim 5, further comprising:
a third metal layout pattern associated with forming a third metal structure of the standard cell, the third metal layout pattern being configured to overlap the first polysilicon layout pattern and the second metal layout pattern.

7. The layout design of claim 1, further comprising:
a second polysilicon layout pattern associated with forming a second polysilicon structure of the standard cell, the second polysilicon layout pattern being configured to overlap the first active area layout pattern; and
a third metal layout pattern associated with forming a third metal structure of the standard cell, the third metal layout pattern being configured to overlap the second polysilicon layout pattern, and the second metal layout pattern and the third metal layout pattern being horizontally separated according to a predetermined spacing rule.

8. A physical semiconductor structure comprising:
a first active area structure;
an isolation structure surrounding the first active area structure;
a first polysilicon structure over the first active area structure;
a first metal structure directly over a first portion of the first active area structure, the first metal structure comprising a first portion on a first side of the first polysilicon structure and a second portion on a second side of the first polysilicon structure opposite the first side of the first polysilicon structure; and
a second metal structure comprising a continuous portion directly over and in contact with a portion of the first polysilicon structure, in contact with the first portion of the first metal structure and in contact with the second portion of the first metal structure.

9. The physical semiconductor structure of claim 8, wherein the second metal structure is further directly over a second portion of the first active area structure and a portion of the isolation structure.

10. The physical semiconductor structure of claim 9, wherein the second metal structure extends horizontally beyond the first active area structure along a channel width direction of the first active area structure.

11. The physical semiconductor structure of claim 9, wherein the second metal structure extends horizontally beyond the first active area structure along a channel length direction of the first active area structure.

12. The physical semiconductor structure of claim 9, further comprising:
a second polysilicon structure over the first active area structure; and
a third metal structure directly over and in contact with the second polysilicon structure, and the second metal structure and the third metal structure being horizontally separated according to a predetermined spacing rule.

13. The physical semiconductor structure of claim 8, wherein the first active area structure comprises a fin structure.

14. The physical semiconductor structure of claim 8, further comprising:
a second active area structure surrounded by the isolation structure, the first active area structure constitutes a portion of a P-type transistor, and the second active area structure constitutes a portion of an N-type transistor, and the structure polysilicon structure being over the second active area.

15. The physical semiconductor structure of claim 14, further comprising:
a third metal structure directly over and in contact with the first polysilicon structure and in contact with the second metal structure.

16. An integrated circuit designing system, comprising:
a non-transitory storage medium, the non-transitory storage medium being encoded with a layout design of a standard cell, the layout design comprising:
a first active area layout pattern associated with forming a first active area structure of the standard cell, an isolation region being outside at least the first active area layout pattern;
a first polysilicon layout pattern associated with forming a first polysilicon structure of the standard cell, the first polysilicon layout pattern being configured to overlap the first active area layout pattern;
a first metal layout pattern associated with forming a first metal structure of the standard cell, the first metal layout pattern comprising a first pattern portion on a first side of the first polysilicon layout pattern and a second pattern portion on a second side of the first polysilicon layout pattern opposite the first side of the first polysilicon pattern, the first metal layout pattern being configured to overlap the first active area layout pattern; and
a second metal layout pattern associated with forming a second metal structure of the standard cell, the second metal layout pattern comprising a continuous portion configured to overlap the first polysilicon layout pattern, the first pattern portion of the first active layout pattern and the second pattern portion of the first metal layout pattern; and
a hardware processor communicatively coupled with the non-transitory storage medium and configured to execute a set of instructions for generating an integrated circuit layout based on an original circuit design and the layout design of the standard cell.

17. The integrated circuit designing system of claim 16, wherein the second metal layout pattern is further configured to overlap the first active layout pattern and the isolation region.

18. The integrated circuit designing system of claim 16, wherein the layout design of the standard cell encoded in the non-transitory storage medium further comprises:
   a second active area layout pattern associated with forming a second active area of the standard cell, the isolation region also being outside the second active area layout pattern, the first active area layout pattern being in a P-type transistor area, and the second active area layout pattern being in an N-type transistor, and the first polysilicon layout pattern being over the second active area layout pattern.

19. The integrated circuit designing system of claim 18, wherein the layout design of the standard cell encoded in the non-transitory storage medium further comprises:
   a third metal layout pattern associated with forming a third metal structure of the standard cell, the third metal layout pattern being configured to overlap the first polysilicon layout pattern and the second metal layout pattern.

20. The integrated circuit designing system of claim 16, wherein the layout design of the standard cell encoded in the non-transitory storage medium further comprises:
   a second polysilicon layout pattern associated with forming a second polysilicon structure of the standard cell, the second polysilicon layout pattern being configured to overlap the first active area layout pattern; and
   a third metal layout pattern associated with forming a third metal structure of the standard cell, the third metal layout pattern being configured to overlap the second polysilicon layout pattern, and the second metal layout pattern and the third metal layout pattern being horizontally separated according to a predetermined spacing rule.

21. A method of generating a layout design usable for manufacturing a standard cell, the method comprising:
   generating, using a computer, an active area layout pattern associated with forming an active area structure of the standard cell, an isolation region being outside at least the active area layout pattern;
   generating a polysilicon layout pattern associated with forming a polysilicon structure of the standard cell, the polysilicon layout pattern being configured to overlap the active area layout pattern;
   generating a first metal layout pattern associated with forming a first metal structure of the standard cell, the first metal layout pattern comprising a first pattern portion on a first side of the first polysilicon layout pattern and a second pattern portion on a second side of the first polysilicon layout pattern opposite the first side of the first polysilicon pattern, the first metal layout pattern being configured to overlap the active area layout pattern; and
   generating a second metal layout pattern associated with forming a second metal structure of the standard cell, the second metal layout pattern comprising a continuous portion configured to overlap the polysilicon layout pattern, the first pattern portion of the first active layout pattern and the second pattern portion of the first metal layout pattern.

22. The method of claim 21, wherein the generating the second metal layout pattern is performed in a manner that the second metal layout pattern overlaps the active layout pattern and the isolation region.

23. The method of claim 21, further comprising:
   performing a design rule check to determine if a design rule violation associated with the second metal layout pattern exists; and
   resolving the design rule violation by moving the second metal layout pattern into or further into the isolation region.

* * * * *